United States Patent [19]
Hotta

[11] Patent Number: 5,418,179
[45] Date of Patent: May 23, 1995

[54] PROCESS OF FABRICATING COMPLEMENTARY INVERTER CIRCUIT HAVING MULTI-LEVEL INTERCONNECTION

[75] Inventor: Tadahiko Hotta, Shizuoka, Japan

[73] Assignee: Yamaha Corporation, Hamamatsu, Japan

[21] Appl. No.: 291,728

[22] Filed: Aug. 16, 1994

Related U.S. Application Data

[60] Continuation of Ser. No. 14,421, Feb. 5, 1993, abandoned, which is a division of Ser. No. 815,632, Dec. 30, 1991, abandoned, which is a continuation of Ser. No. 358,622, May 30, 1989, abandoned.

[30] Foreign Application Priority Data

May 31, 1988 [JP] Japan .................. 63-134882
Jun. 25, 1988 [JP] Japan .................. 63-157507

[51] Int. Cl.⁶ .......................................... H01L 21/70
[52] U.S. Cl. ........................................ 437/57; 257/371; 257/384; 257/754; 257/770; 437/34; 437/56; 437/200; 437/193; 148/DIG. 19; 148/DIG. 147
[58] Field of Search ............... 257/371, 384, 383, 508, 257/647, 754, 770; 437/57, 56, 34, 200, 44, 189, 191, 192, 193; 148/DIG. 19, DIG. 147

[56] References Cited

U.S. PATENT DOCUMENTS

| | | | |
|---|---|---|---|
| 4,374,700 | 2/1983 | Scott et al. | 437/34 |
| 4,682,403 | 7/1987 | Hartmann et al. | 437/34 |
| 4,804,636 | 2/1989 | Groover, III et al. | 437/56 |
| 4,873,204 | 10/1989 | Wong et al. | 437/200 |
| 4,890,141 | 12/1989 | Tang et al. | 357/23.3 |
| 4,929,992 | 5/1990 | Thomas et al. | 357/23.9 |
| 4,939,154 | 7/1990 | Shimbo | 437/41 |
| 4,939,567 | 7/1990 | Kenney | 357/42 |
| 5,010,032 | 4/1991 | Tang et al. | 437/57 |
| 5,066,995 | 11/1991 | Young et al. | 357/42 |
| 5,086,006 | 2/1992 | Asahina | 437/57 |
| 5,089,429 | 2/1992 | Hsu | 437/57 |
| 5,093,276 | 3/1992 | Asahina | 437/200 |
| 5,124,280 | 6/1992 | Wei et al. | 437/193 |
| 5,134,085 | 7/1992 | Gilgen et al. | 437/57 |
| 5,154,946 | 10/1992 | Zdebel | 437/57 |
| 5,173,450 | 12/1992 | Wei | 437/193 |
| 5,190,886 | 3/1993 | Asahina | 437/57 |
| 5,190,893 | 3/1993 | Jones, Jr. et al. | 437/192 |
| 5,298,782 | 3/1994 | Sundaresan | 437/191 |
| 5,302,539 | 4/1994 | Haken et al. | 437/200 |
| 5,304,502 | 4/1994 | Hanagasaki | 437/57 |
| 5,318,924 | 6/1994 | Lin et al. | 437/200 |
| 5,338,701 | 8/1994 | Hsu et al. | 437/193 |
| 5,366,928 | 11/1994 | Wolters et al. | 437/193 |

FOREIGN PATENT DOCUMENTS

| | | | |
|---|---|---|---|
| 0017655 | 2/1983 | Japan | 437/34 |
| 0055056 | 3/1984 | Japan | 437/34 |
| 0179143 | 8/1987 | Japan | 437/56 |
| 0283828 | 11/1989 | Japan | 437/56 |
| 0007463 | 1/1990 | Japan | 437/56 |
| 0022861 | 1/1990 | Japan | 437/56 |
| 0032056 | 2/1991 | Japan | 437/56 |

OTHER PUBLICATIONS

Lai et al., "Design and Characteristics of a Lightly Doped Drain (LDD) Device Fabricated with Self-Aligned Titanium Disilicide" *IEEE Transactions on Electron Devices*, vol. ED-33, No. 3, Mar. 1986, pp. 345–353.

Tang et al., "VLSI Local Interconnect Level Using Titanium Nitride" IEDM 1985, pp. 590–593.

Primary Examiner—Olik Chaudhuri
Assistant Examiner—Long Pham
Attorney, Agent, or Firm—Burns, Doane, Swecker & Mathis

[57] ABSTRACT

An integrated circuit is fabricated on a semiconductor substrate and comprises an n channel type field effect transistor, a p channel type field effect transistor and an interconnection coupled between the drain regions of the two field effect transistors, and each of the gate electrodes and the interconnection is provided with a polycrystalline silicon and a refractory metal silicide deposited over the polycrystalline silicon, wherein side spacers are eliminated from the gate electrodes and the interconnection, because no short circuiting takes place between the gate electrodes and the source and drain regions by virtue of the deposition of the refractory metal silicide.

7 Claims, 14 Drawing Sheets

PROCESS OF FABRICATING COMPLEMENTARY INVERTER CIRCUIT HAVING MULTI-LEVEL INTERCONNECTION

This application is a continuation of application Ser. No. 08/014,421, filed Feb. 5, 1993, now abandoned, which in turn is a Divisional application Ser. No. 07/815,632, filed Dec. 30, 1991, now abandoned, which in turn is a Continuation application of Ser. No. 07/358,622, filed May 30, 1989, now abandoned.

FIELD OF THE INVENTION

This invention relates to a semiconductor device and, more particularly, to a complementary inverter circuit incorporated in an integrated circuit fabricated on a semiconductor substrate.

DESCRIPTION OF THE RELATED ART

Referring first to FIG. 1 of the drawings, there is shown a part of an integrated circuit implemented by complementary inverter circuits 1 and 2 arranged in cascade. The complementary inverter circuits 1 and 2 are coupled between two voltage lines Vdd and Vss, and the voltage lines Vdd and Vss respectively propagate a positive voltage level and a ground level, respectively. The complementary inverter circuit 1 is provided with a p-channel type field effect transistor 3 and an n-channel type field effect transistor 4 coupled in series the gate electrodes of which are coupled to a signal line 5. Similarly, the complementary inverter circuit 2 is formed by p-channel type and an n-channel type field effect transistors 6 and 7, and the gate electrodes thereof are commonly coupled to an output node 8 shared by the drain nodes of the field effect transistors 3 and 4. An output node 9 of the complementary inverter circuit 2 is coupled to an input node of the subsequent inverter circuit. Such multiple stage the complementary inverter circuits 1 and 2 are by way of example used in a delay circuit for retarding a signal propagation.

When the complementary inverter circuit 1 is fabricated on a single semiconductor substrate 11, the p-channel type field effect transistor 3 is formed in a surface portion 12 of the substrate 11, however, the n-channel type field effect transistor 4 is formed in a p-type well 13 as illustrated in FIG. 2. On a major surface of the substrate 11 is formed a thin gate oxide film which is located beneath a wiring strip 14 serving as the gate electrodes of both field effect transistors 3 and 4. The entire major surface as well as the wiring strip 14 is covered with an inter-level insulating layer 15 which is formed with five contact windows 16, 17, 18, 19 and 20. For providing an interconnection between drain regions of both field effect transistors 3a and 4, a wiring strip 21 is formed on the inter-level insulating layer 15, and both end portions of the wiring strip 21 respectively pass through the contact windows 17 and 19 to contact with the drain regions. The contact window 16 allows the voltage line Vdd to reach the source region of the p-channel type field effect transistor 3, and the other voltage line Vss passes through the contact window 20 and, accordingly, contacts with the source region of the n-channel type field effect transistor 4. As described above, the wiring strip 14 needs to couple to the signal line 5, so that the contact window 18 is provided for the interconnection therebetween.

The complementary inverter circuit thus arranged in a multi-level structure is fabricated through a process sequence hereinunder described with reference to FIGS. 3A to 3C. The process sequence starts with preparation of the semiconductor substrate 11 of an n-type single crystalline silicon. The p-type well 13 is formed in the surface portion of the substrate 11, and a thick field oxide film 31 is grown by using the local oxidation of silicon technique. The thick field oxide film 31 defines active areas in the substrate and isolates the p-type well 13 from the surface portion 12. After the formation of the thick field oxide film 31, a thin oxide film 32 is thermally grown on the active area, and channel dopings are carried out by using an ion implantation technique. On the entire surface of the structure is deposited polycrystalline silicon which provides a polysilicon layer 33. The resultant structure of this stage is illustrated in FIG. 3A.

Subsequently, the polysilicon layer 33 is partially etched and patterned to form the wiring strip 14 parts of which provide the gate electrodes 34 and 35 of the field effect transistors 4 and 3. Ion implantations follow the formation of the gate electrodes 34 and 35 in a self-align fashion to produce the source and drain regions 36 of the n-channel type field effect transistor 4 and to produce the source and drain regions 37 of the p-channel type field effect transistor 3. Namely, on the entire structure is applied a photoresist film which is patterned to cover the surface region 12 but expose the p-type well. N-type impurity atoms such as phosphorus or arsenic are introduced in the p-type well 13 using the gate electrode 34 as a mask. After the mask is stripped off, a fresh photoresist film is spun coated on the entire surface and patterned to expose the surface portion 12. Using the gate electrode 35 as a mask, p-type impurity atoms such as boron are ion implanted into the surface portion 12. Thus, the p-type source and drain regions 37 are formed in the surface portion 12, and the n-type source and drain regions 36 are nested in the p-type well 13. The inter-level insulating layer 15 of the phosphosilicate glass is deposited on the entire surface of the structure and, then, is partially removed to form the contact windows 16 to 20. The resultant structure of this stage is illustrated in FIG. 3B.

After the formation of the contact windows 16 to 20, an aluminum-silicon alloy is deposited on the entire surface of the structure to form a metal layer which is partially etched away to form the wiring strip 21 as well as the voltage lines Vdd and Vss as will be seen from FIG. 3C. The prior art structure illustrated in FIG. 3C has the wiring strip 14 of the polycrystalline silicon, however, the wiring strip 14 may be overlain by a refractory metal silicide film in another prior art example.

Turning to FIGS. 4A to 4C, another prior art process sequence for fabrication of a complementary inverter circuit is illustrated. The process sequence starts with preparation of an n-type single crystalline silicon substrate 41. A p-type well 42 is formed in the substrate 41, and a thick field oxide film 43 is grown in a peripheral area as well as the boundary area between the p-type well and a surface portion 41A of the substrate 41. A thin oxide film is thermally grown on the exposed major surface of the substrate 41, and channel dopings are carried out through the thin oxide film. Polycrystalline silicon is deposited on the entire surface of the structure and, then, partially etched away to pattern a wiring strip for gate electrodes 44 and 45 on gate oxide films as well as an interconnection 46, and the interconnection 46 is provided over the thick field oxide film 43 on the boundary area.

With a patterned photoresist mask covering the surface portion 43, n-type impurity atoms are lightly doped into the p-type well 42 by using the gate electrode 44 as an ion implantation mask to form shallow source and drain regions. After the photoresist mask covering the surface portion 43 is removed, a fresh photo-mask is provided on the p-type well 42, and, then, p-type impurity atoms are ion implanted into the surface portion 43 to form heavily doped source and drain regions 47. After the patterned photoresist mask is stripped off from the p-type well 42, a silicon oxide is deposited on the entire surface and, thereafter, anisotropically etched away to form side spacers 48 to 53 on both sides of the gate electrodes 44 and 45 as well as both side of the interconnection 46, respectively. After the surface portion 43 is covered with a mask film again, the n-type impurity atoms are heavily doped into the p-type well 42 by using the gate electrode 44 and the side spacers 48 and 49 as an ion implantation mask, thereby forming a relatively deep source and drain regions. The relatively deep source and drain regions are partially overlapped with the shallow source and drain regions, and, accordingly, the lightly doped drain (which is abbreviated as LDD) structure is formed in the p-type well 42. The source and drain regions of the LDD structure are designated by reference numerals 54. The resultant structure of this stage is illustrated in FIG. 4A. As well known in the art, the lightly doped drain structure enhances the hot electron resistivity of the n-channel field effect transistor, and, accordingly, any driftage hardly takes place in the transistor's characteristics.

The subsequent stage is the formation of multi-level wirings. First, titanium is deposited on the entire surface of the structure by using a sputtering technique, and the structure is placed in a high temperature nitrogen ambient. Then, titanium reacts with nitrogen to produce a titanic nitride (TiN) film 55, and titanium on the silicon substrate 41, the interconnection 46 and the polysilicon gate electrodes 44 and 45 is diffused thereinto, thereby forming titanic silicide (TiSi$_2$) films 56, 57, 58, 59 and 60 in the source and drain regions 47 and 54 and further on the interconnection 46 and the gate electrodes 44 and 45. The resultant structure of this stage is illustrated in FIG. 4B.

The formation of the multi-level wirings is followed by a lithographic process so as to form a multi-level interconnection 61 as well as a multi-level gate electrodes 62 and 63. The multi-level interconnection 61 is provided with the polysilicon film 46, the silicide film 58 and the titanic nitride film, and the titanic nitride film extends to the silicide films 56 and 57 over the respective drain regions 56 and 57. Thus, when the formation of the multi-level interconnection 61 is completed, an insulating material is deposited over the entire surface of the structure to form an inter-level insulating layer 64, and contact windows 65 and 66 are formed in the inter-level insulating layer 64 to expose the silicide films 56 and 57 over the source regions. A metal is sputtered onto the entire surface of the structure which projects through the contact windows 65 and 66 and reaches the upper surfaces of the silicide films 56 and 57. The metal film is etched and patterned to form voltage lines Vss and Vdd, and the resultant structure is illustrated in FIG. 4C. The structure shown in FIG. 4C is disclosed in IEDM 1985, pages 590 to 593.

However, a problem is encountered in the prior art example shown in FIGS. 3A to 3C in that the complementary inverter circuit occupies a relatively large area on the silicon substrate. This is because of the fact that the contact windows 17 and 19 are needed to interconnect the drain regions 36 and 37 of the field effect transistors 3 and 4. In general, when a contact window is formed over an impurity region, the impurity region should be increased in area due to a tolerance of the mask alignment. For this reason, the occupation area of each complementary inverter circuit tends to be increased.

In the prior art example shown in FIGS. 4A to 4C, no contact window is necessary for the drain regions, so that the complementary inverter circuit merely occupies a relatively small area, However, another problem is encountered in complexity of the process sequence. Namely, the structure shown in FIG. 4C has the gate electrode provided with the side spacers, and additional deposition process, heating process and lithographic process are required for the formation of the side spacers. Even though the LDD structure is not employed in the source and drain regions, the side spacers are necessary for perfect isolation of the gate electrodes from the source and drain regions in so far as the silicide films are formed on the polysilicon films by using the heat treatment. For this reason, the additional processes are indispensable and, accordingly, make the process sequence complicate. Moreover, the triplicate structure of the polysilicon, the titanic silicide and the titanic nitride are inferior in reproducibility, so that unintentional disconnection or short circuiting are liable to take place.

SUMMARY OF THE INVENTION

To accomplish these objects, the present invention proposes to deposit an upper film of a silicide on the lower film of the polysilicon, thereby forming a multiple-level structure.

In accordance with one aspect of the present invention, there is provided a semiconductor device fabricated on a single semiconductor substrate of a first conductivity type and providing an integrated circuit having a complementary inverter circuit, the semiconductor substrate having a surface region and a well of a second conductivity type opposite to the first conductivity type, comprising: a) a thick insulating film formed in a boundary area between the surface portion and the well; b) a first field effect transistor fabricated in the well and having source and drain regions separated by a channel forming region, a gate insulating film formed on at least the channel forming region and a gate electrode provided on the gate insulating film; c) a second field effect transistor fabricated in the surface portion and having source and drain region separated by a channel forming region, a gate insulating film formed on at least the channel forming region and a gate electrode provided on the gate insulating film, the first and second field effect transistors forming in combination the complementary inverter circuit; and d) an interconnection extending over the thick insulating film and contacted at both end portion thereof with the drain regions of the first and second field effect transistors, respectively, wherein the interconnection is provided with a lower film of a conductive polycrystalline silicon formed on the thick insulating film and an upper film of a conductive silicide covering the exposed surface of the lower film and contacting the drain regions.

In accordance with another aspect of the present invention, there is provided a process of fabricating a semiconductor device providing an integrated circuit with a complementary inverter circuit, comprising the steps of: a) preparing a semiconductor substrate of a first conductivity type; b) forming a well of a second conductivity type opposite to the first conductivity type in the semiconductor substrate; c) forming a thick insulating film a part of which is provided on a boundary area between the well and a surface region of the semiconductor substrate; d) forming thin insulating films on the surface of the well and the surface of the surface region, respectively; e) depositing a conductive polycrystalline silicon film over the thin insulating films and the thick insulating film; f) pattering the conductive polycrystalline silicon film to form openings over respective contact areas in the well and the surface region, respectively, as well as a lower film of an interconnection on the thick insulating film; g) exposing the contact areas; h) depositing a conductive silicide film on the entire surface; i) patterning the conductive silicide film to form an upper film of the interconnection and respective upper films of gate electrodes; j) patterning the conductive polycrystalline silicon film to form respective lower films of the gate electrodes; and k) forming source and drain region of the first conductivity type in the well and source and drain regions of the second conductivity type in the surface region in such a manner that the drain regions are brought into contact with the upper film of the interconnection, the drain regions extending into the contact areas, respectively, thereby completing first and second field effect transistors which form in combination said complementary inverter circuit.

BRIEF DESCRIPTION OF THE DRAWINGS

The features and advantages of the structure of a semiconductor device and a process of fabrication thereof according to the present invention will be more clearly understood from the following description taken in conjunction with the accompanying drawings in which.

DESCRIPTION OF THE PREFERRED EMBODIMENTS

First embodiment

Figure 5:
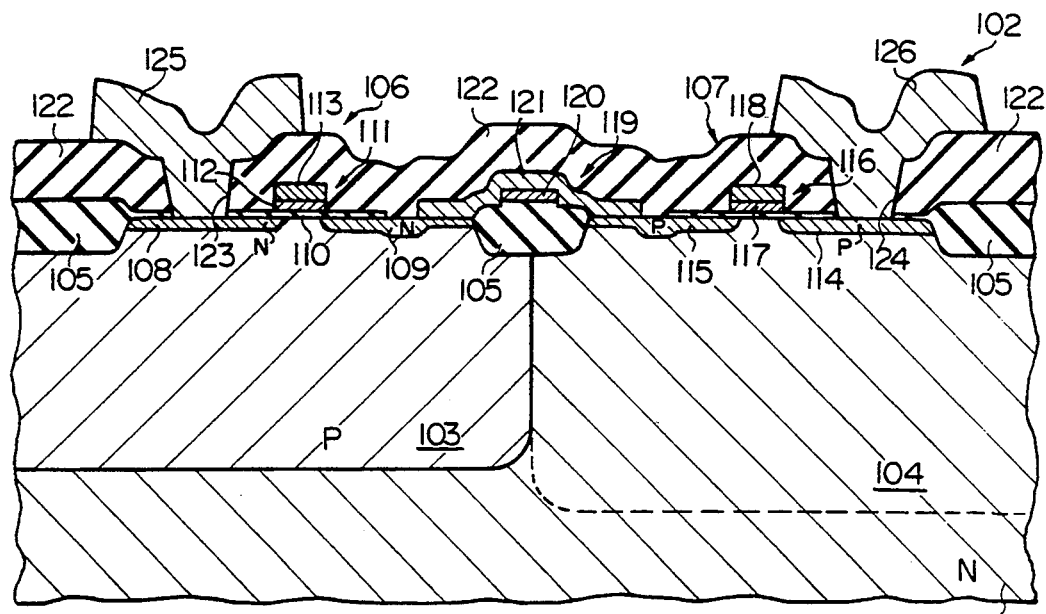
FIG. 5 is a cross sectional view showing the structure of a semiconductor device embodying the present invention.
Figure 6:
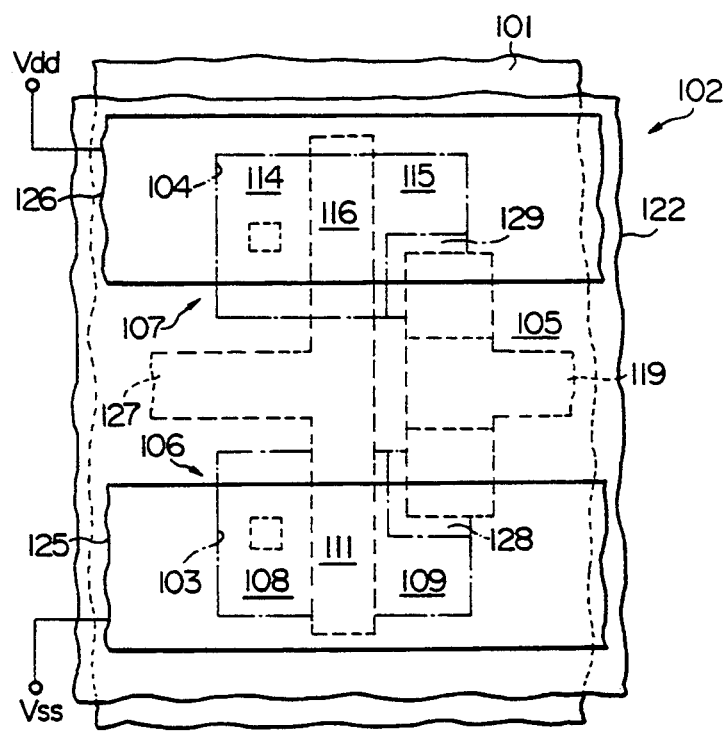
FIG. 6 is a plane view showing the layout of the semiconductor device shown in FIG. 5.

Referring first to FIGS. 5 and 6 of the drawings, there is shown the structure of a semiconductor device fabricated through a process sequence according to the present invention. The semiconductor device is fabricated on a single substrate 101 formed of an n-type single crystalline silicon and provides an integrated circuit including a complementary inverter circuit 102. In the substrate 101 is formed a heavily doped p-type well 103 which is electrically isolated from a heavily doped n-type surface portion 104 by virtue of the p-n junction produced therebetween. For defining an active area, a thick field oxide 105 is grown on the major surface of the substrate 101, and an n channel type field effect transistor 106 and a p channel type field effect transistor 107 are formed in the p-type well 103 and the surface portion 104, respectively.

The n channel type field effect transistor 106 comprises heavily doped n type source and drain regions 108 and 109 separated by a channel forming region, a gate insulating film 110 extending over the channel forming region as well as parts of the source and drain regions 108 and 109, and the multi-level gate electrode 111 is constituted by a lower film 112 of a doped polysilicon and an upper film 113 of a refractory metal silicide. Similarly, the p channel type field effect transistor 107 comprises heavily doped p-type source and drain regions 114 and 115 separated by a channel forming region, a gate insulating film covering the channel forming region as well as parts of the source and drain regions 114 and 115, and a multi-level gate electrode 116 constituted by a lower film 117 of the polysilicon and an upper film 118 of the refractory metal silicide. On the thick field oxide film 105 located between the p-type well and the surface region 104 is provided an interconnection 119 which also has a multi-level structure with a lower film 120 of the polysilicon and an upper film 121 of the refractory metal silicide. In this instance, the upper films 113, 118 and 121 are formed of the tungsten silicide represented by the molecular formula of $WSi_2$. However, the upper films may be formed of another silicide such as, for example, titanium silicide ($TiSi_2$), zirconium silicide ($ZrSi_2$), hafnium silicide ($HfSi_2$), tantalum silicide ($TaSi_2$), molybdenum silicide ($MoSi_2$), cobalt silicide ($CoSi_2$), nickel silicide ($NiSi_2$), platinum silicide ($PtSi$) or palladium silicide ($Pd_2Si$). The upper film 121 extends over the drain regions 109 and 115, and, for this reason, the drain regions are electrically connected to each other through the interconnection 119.

The thick field oxide film 105, the n channel type and p channel type field effect transistors 106 and 107, and the interconnection 119 are covered with an inter-level insulating film 122 in which contact windows 123 and 124 are formed to expose the source regions 108 and 114, and voltage lines 125 and 126 respectively pass through the contact windows 123 and 124 and reaches the source regions 108 and 114, respectively.

As will be better seen from FIG. 6, the multi-level gate electrodes 111 and 116 are provided in a multi-level wiring strip 127, and the multi-level interconnection 119 comes at the both end thereof into contact with respective contact areas 128 and 129 of the drain regions 109 and 115 in an ohmic fashion.

Figure 7A:
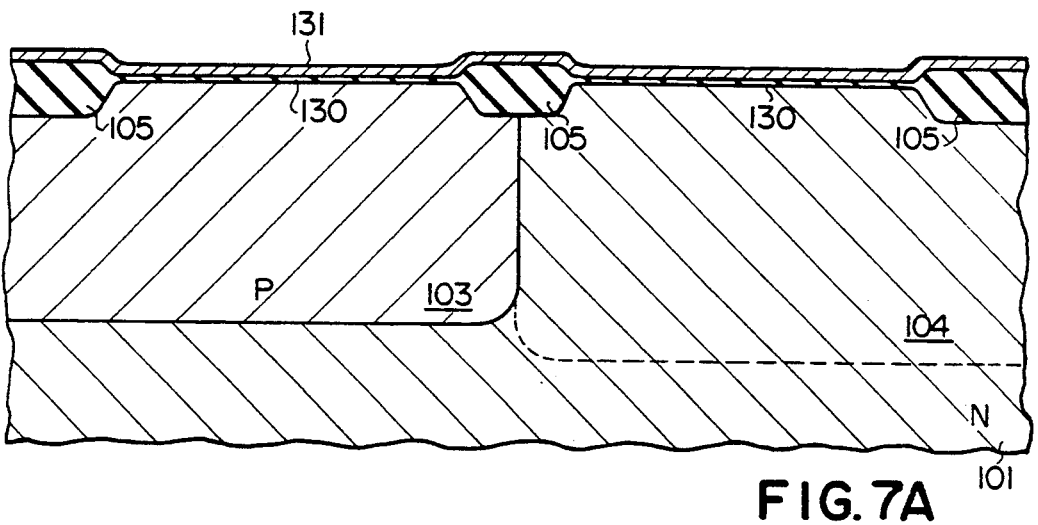
FIGS. 7A to 7F are cross sectional views showing a process sequence for fabricating the semiconductor device shown in FIG. 5.
Figure 7B:
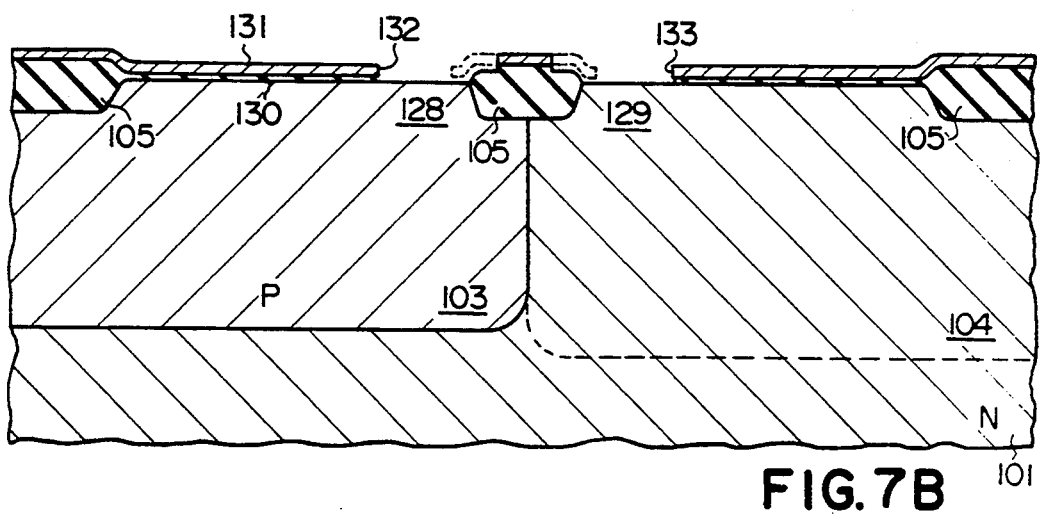

Turning to FIGS. 7A to 7F, a process sequence for the semiconductor device shown in FIG. 5 is illustrated and starts with preparation of the substrate 101. In the substrate 101 is defined the p-type well 103 through lithographic techniques followed by an ion implantation, and the local oxidation of silicon techniques are applied to the resultant structure to form the thick field oxide film 105. A channel doping is carried out for adjustment of threshold voltage levels of the field effect transistors 106 and 107 of the enhancement type. On exposed portions of the substrate 101 are thermally grown a thin oxide film 130 on which a polycrystalline silicon film 131 is deposited by using a chemical vapor deposition technique. N-type impurity atoms such as, for example, phosphorus are doped into the polycrystalline silicon film 131 so as to improve the conductivity. The resultant structure of this stage is illustrated in FIG. 7A.

The subsequent stage is formation of windows 132 and 133. First, the lithographic techniques are applied to the polycrystalline silicon layer 131 to form a mask layer, and the thin oxide film 130 is partially etched away to expose the contact areas 128 and 129. Since the polycrystalline silicon layer 131 perfectly covers the parts of the thin oxide film 130 serving as the gate oxide films of the field effect transistors 106 and 107, the gate oxide films are free from any contamination due to an etchant used in the etching process. The mask layer of the polycrystalline silicon may be patterned to expose the adjacent areas of the thin oxide film 130 as indicated by dot lines in FIG. 7B, being left on the thick oxide layer 105. In this implementation, the thin thermal oxide film 130 are partially removed from the shoulder portions of the thick field oxide layer 105 as also indicated by dot lines in FIG. 7B. In still another implementation, the patterned photoresist layer may be left on the polycrystalline layer 131 and used as the etching mask for the thin oxide film 130.

Figure 7C:
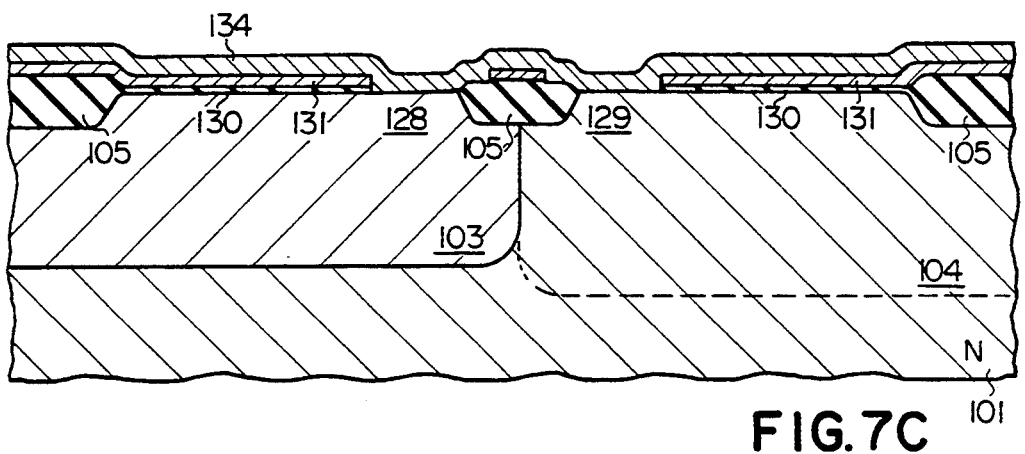

After the formation of the contact windows 132 and 133, a tungsten silicide is sputtered over the entire surface of the structure to form a silicide film 134, however, a chemical vapor deposition technique may be alternatively employed for the deposition of the tungsten silicide. The silicide film 134 is brought into contact with the contact areas 128 and 129, and the polycrystalline silicon layer 131 is overlain by the silicide film 134, thereby achieving the multi-level structure. The resultant structure of this stage is illustrated in FIG. 7C.

Figure 1:
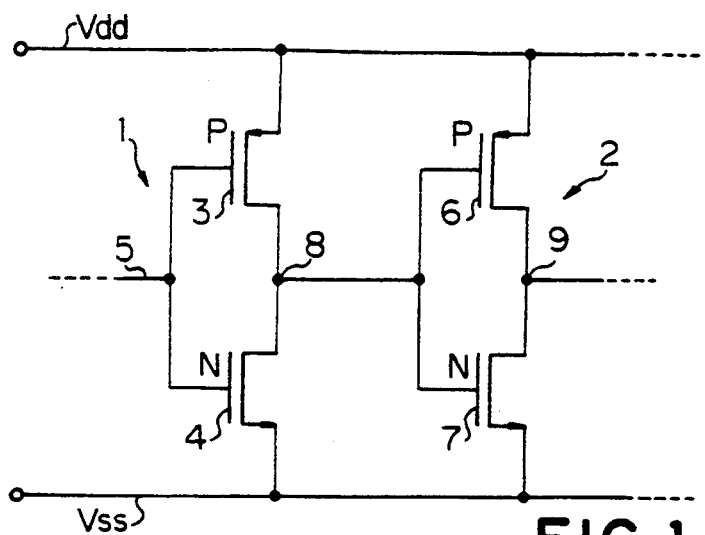
FIG. 1 is a circuit diagram showing a series of complementary inverter circuits to which the present invention appertains.
Figure 2:
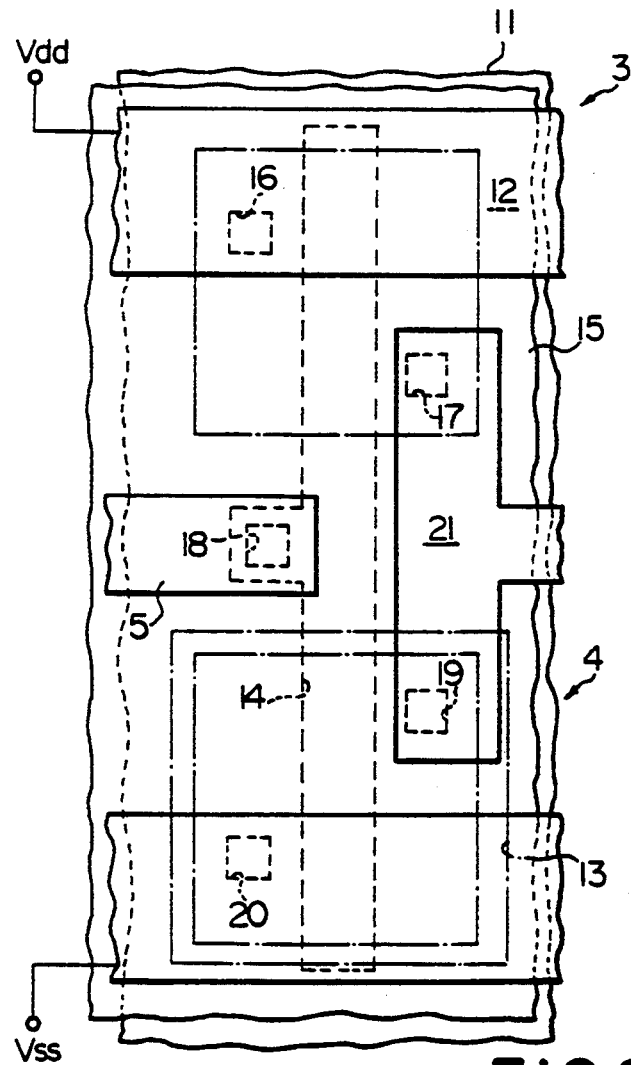
FIG. 2 is a plane view showing the arrangement of a prior art complementary inverter circuit.
Figure 3A:
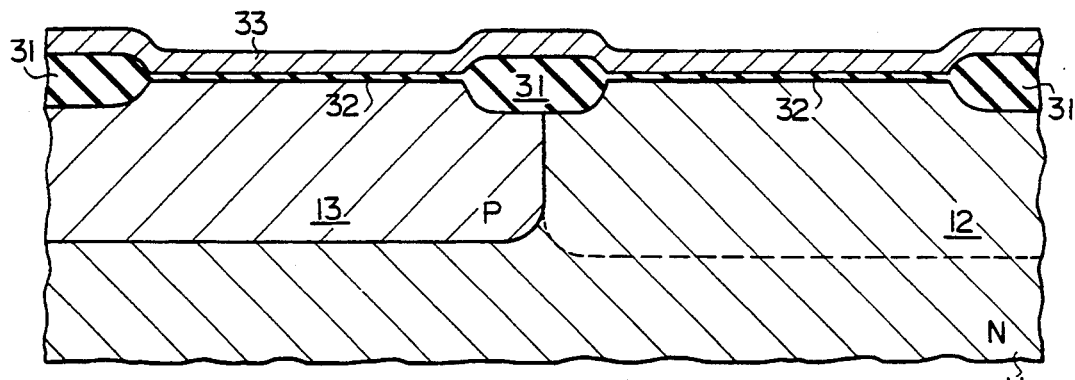
FIGS. 3A to 3C are cross sectional view showing the process sequence through which the prior art complementary inverter circuit of FIG. 2 is fabricated.
Figure 3B:
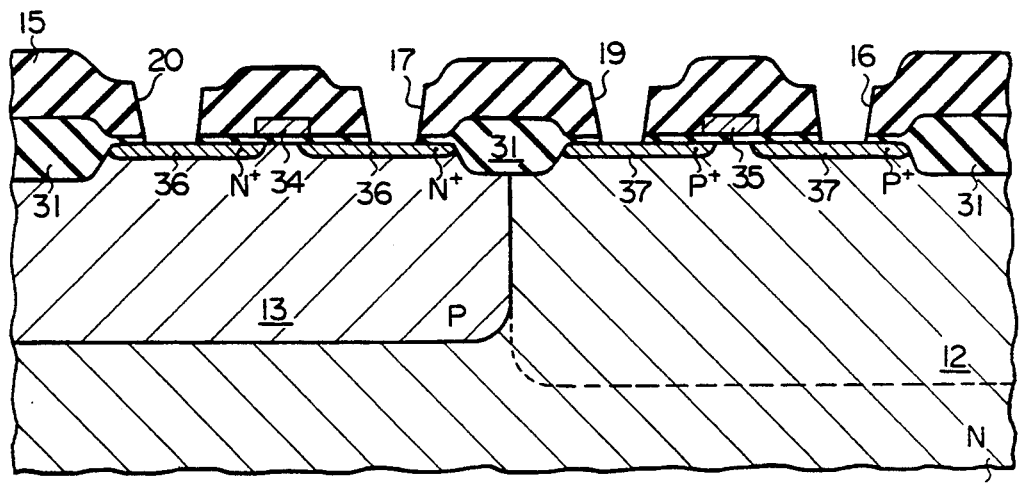
Figure 3C:
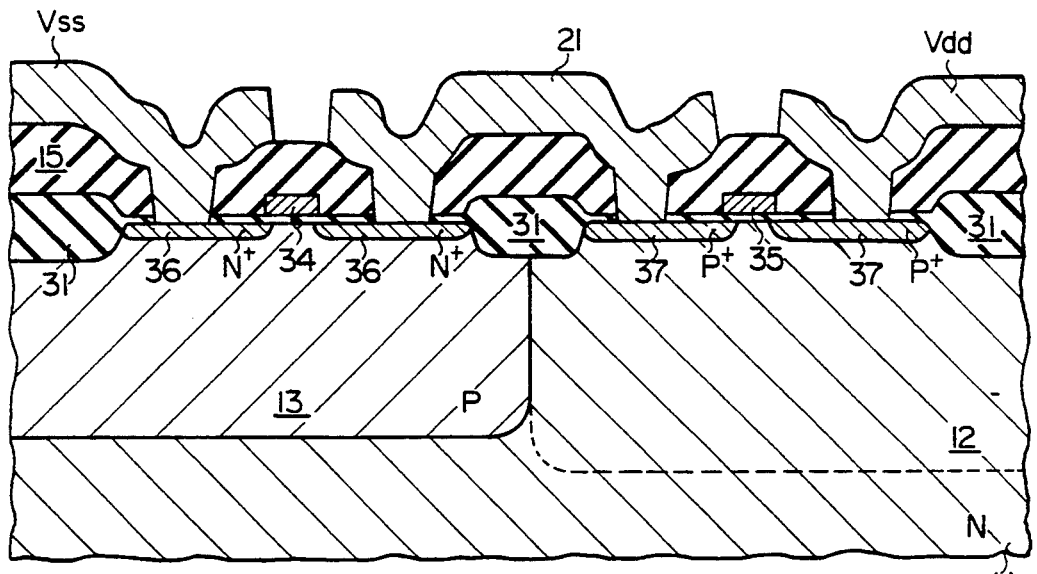
Figure 4A:
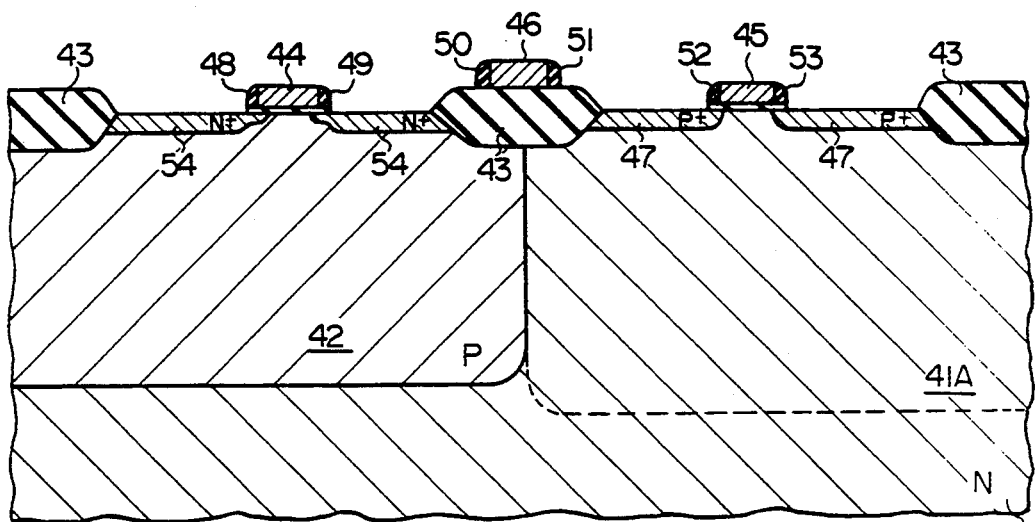
FIG. 4A to 4C are cross sectional view showing another prior art process sequence for fabrication of the complementary inverter circuit.
Figure 4B:
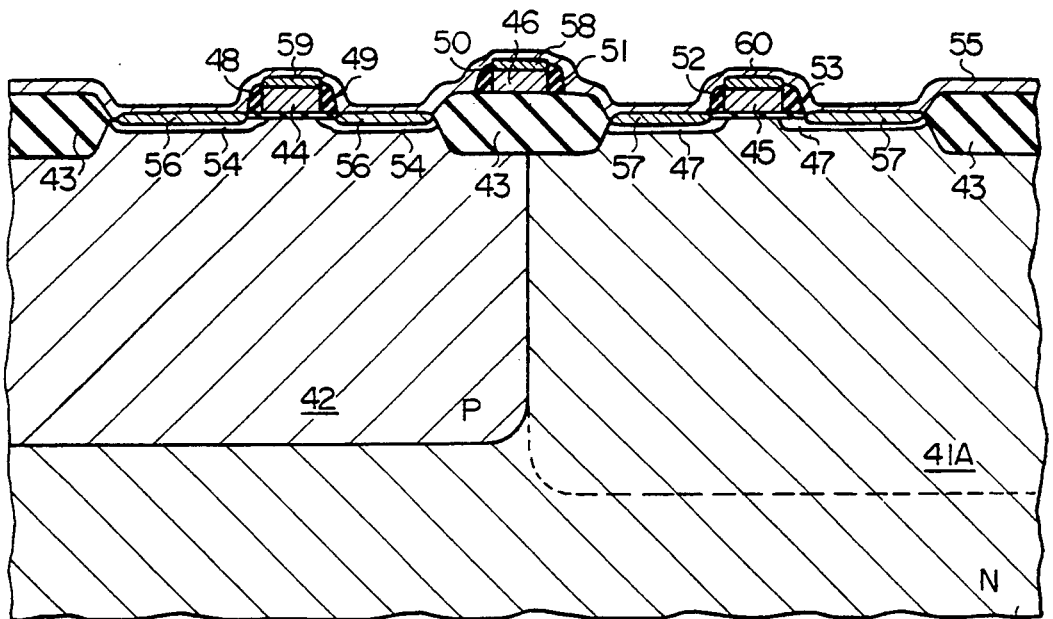
Figure 4C:
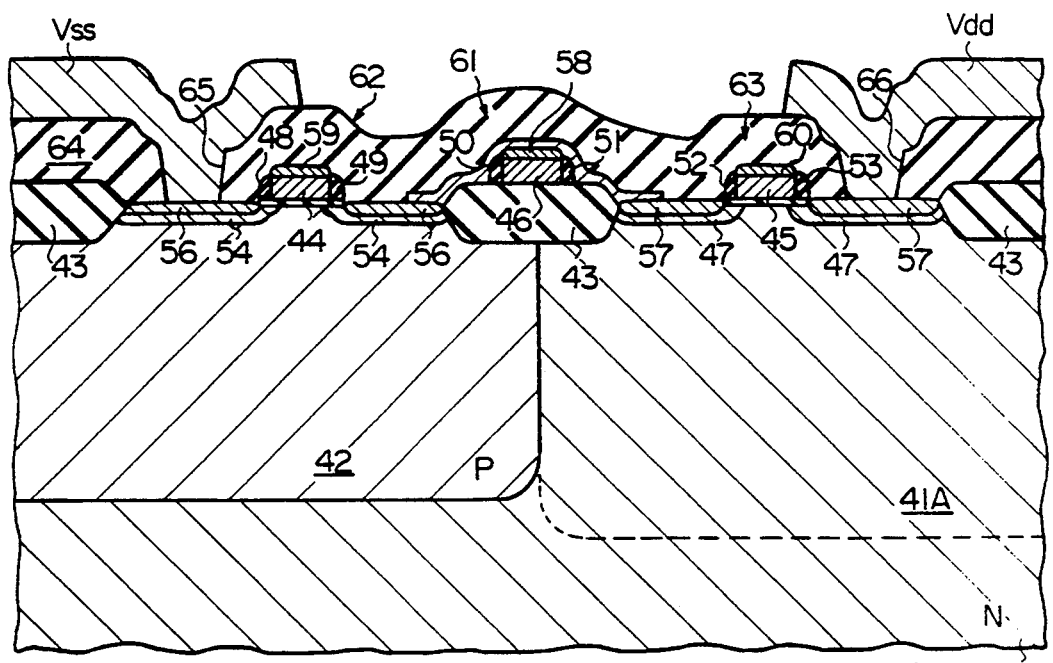
Figure 7D:
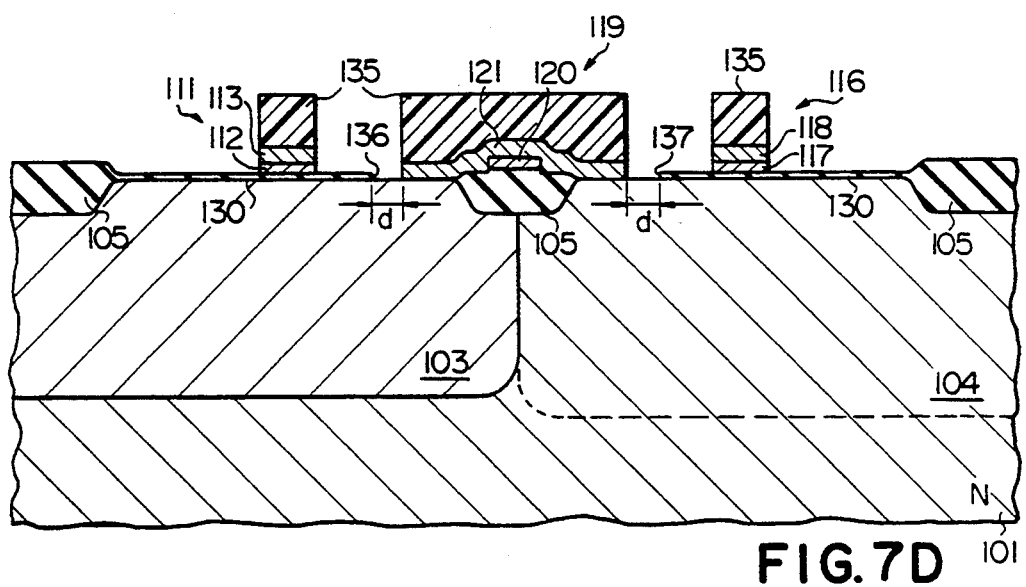

A solution of a photoresist material is spun coated on the entire surface of the structure to form a photoresist film, and the photoresist film is patterned through the lithographic process to form a photo-mask layer 135. Using the photo-mask layer 135, the silicide film 134 and, thereafter, the polycrystalline silicon film 131 are partially etched away to form the multi-level gate electrodes 111 and 116 and the multi-level interconnection 119 by using respective appropriate etchants. The gate electrodes 111 and 116 and the interconnection 119 are thus formed by using the deposition technique and the lithographic process, so that no heat treatment participates the formation of the gate electrodes and the interconnection. In other words, the side walls of the gate electrodes are not covered with any silicide films even if the spacers are not provided thereon. For this reason, the process sequence according to the present invention is simplified in comparison with the prior art process shown in FIGS. 4A to 4C. The photo-mask layer 135 is patterned in such a manner as to partially cover the silicide film 134 on the contact areas 128 and 129, and, for this reason, the silicide film 134 is left partially on the contact areas 128 and 129 and partially on the thick field oxide film 105. That is, a conduction path is established between the contact areas of the drain regions 109 and 115 through the interconnection 119. However, the photo-mask layer 135 merely extend to middle lines of the contact areas 128 and 129, so that openings having respective widths of about d are formed on the contact areas 128 and 129, respectively. The resultant structure of this stage is illustrated in FIG. 7D.

Figure 7E:
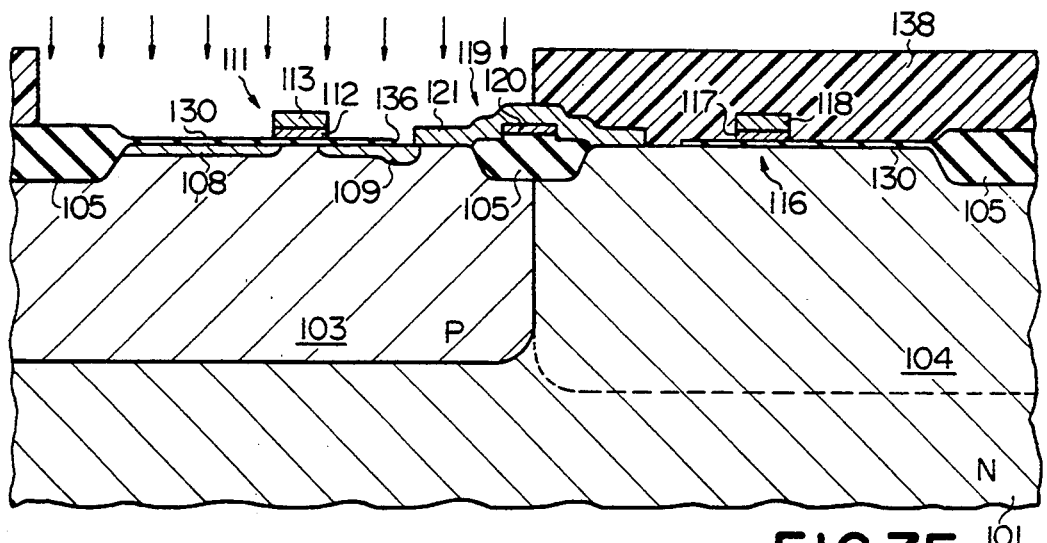

A solution of the photoresist material is spun onto the entire surface of the structure to form a photoresist film again, and the photoresist film is patterned to provide a photo-mask layer 138 covering the surface portion 104 but exposing the p type well 103. N type impurity atoms such as phosphorus or arsenic are implanted into the exposed substrate 101, and, accordingly, the heavily doped source and drain regions 108 and 109 are formed outside of the gate electrode 111. Since the n-type impurity atoms are directly implanted through the opening 136, the impurity profile of the drain region 109 is partially deepened under the opening 136. The resultant structure of this stage is illustrated in FIG. 7E.

Figure 7F:
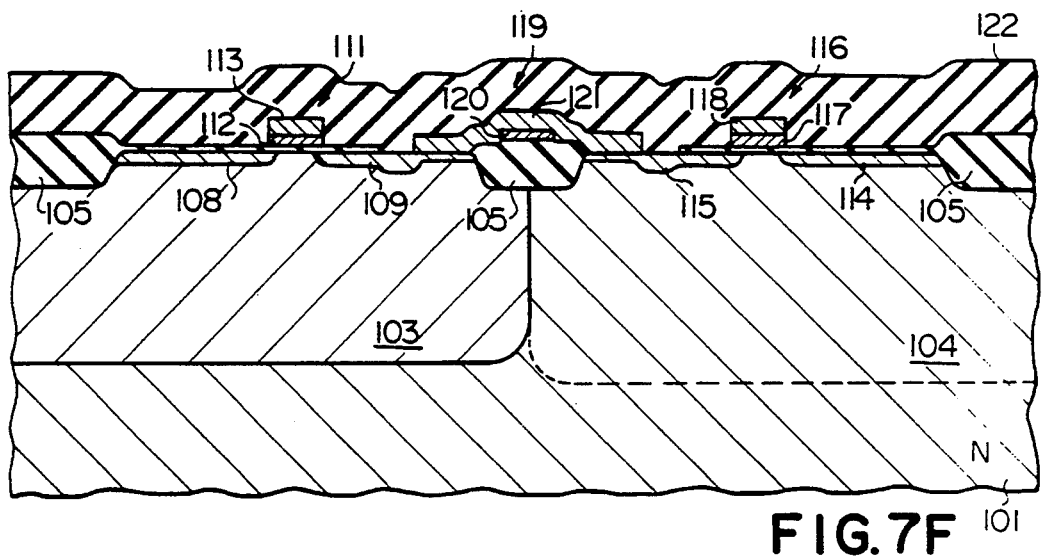

After the formation of the heavily doped source and drain regions 108 and 109, the photo-mask layer 138 is stripped off, and a solution of the photoresist material is spun onto the entire surface again to form a photoresist film. The photoresist film is patterned to expose the surface portion 104 but cover the p-type well 103. P-type impurity atoms such as, for example, boron are implanted into the exposed substrate 101, thereby forming the heavily doped source and drain regions 114 and 115. The p-type impurity atoms are deeply introduced in the substrate 101 under the opening 137 similar to the n-type drain region 109. Subsequently, the inter-level insulating layer 122 of, for example, a phosphosilicate glass is deposited on the entire surface, and a heat treatment is carried out for activation of the implanted impurity atoms. During the heat treatment, the implanted impurity atoms are diffused into the substrate 101, and, accordingly, the drain regions 109 and 115 extend under the upper film 121 of the silicide. Then, a conduction path is established between the drain regions 109 and 115. For the establishment of the conduction path, no contact window is formed over the drain regions 109 and 115, and, for this reason drain regions 109 and 115 are minimized without any consideration of the nesting. This results in reduction in occupation area, and, accordingly, the circuit is increased in integration density. The resultant structure is illustrated in FIG. 7F.

Finally, the contact windows 123 and 124 are formed in the inter-level insulating layer 122, and the voltage lines 125 and 126 are patterned and reach the respective source regions 108 and 124 through the contact windows 123 and 124, respectively, as shown in FIG. 5.

Second embodiment

Figure 8:
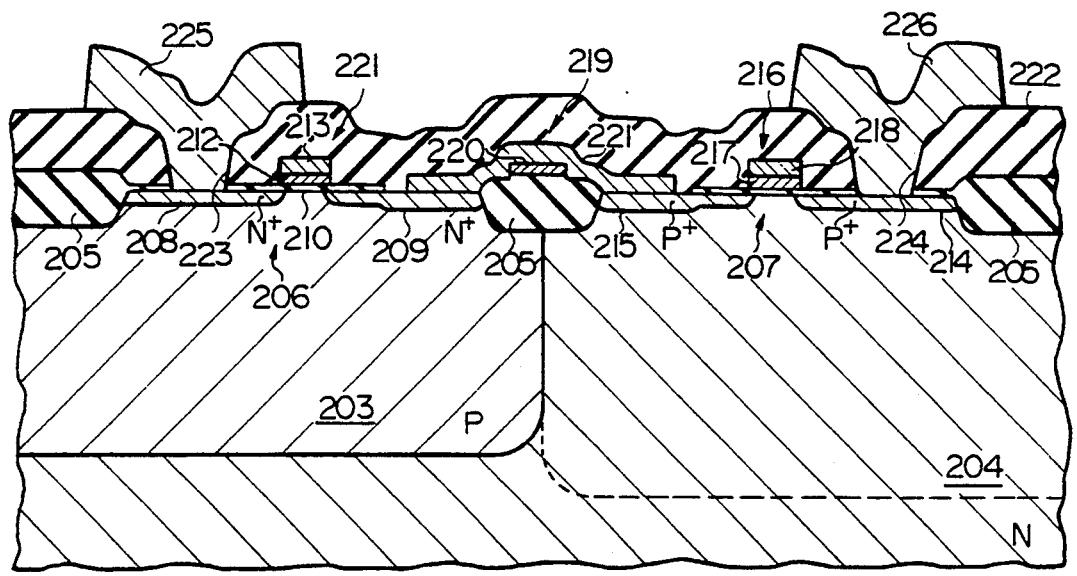
FIG. 8 is a cross sectional view showing the structure of another semiconductor device embodying the present invention.

Turning to FIG. 8 of the drawings, there is shown the structure of another semiconductor device fabricated on a single crystalline silicon substrate 201. The semiconductor device provides an integrated circuit including an complementary inverter circuit 202. In the substrate 201 is formed a heavily doped p-type well 203 which is electrically isolated from a heavily doped n-type surface portion 204 by virtue of the p-n junction produced therebetween. For defining an active area, a thick field oxide 205 is grown on the major surface of the substrate 201, and an n channel type field effect transistor 206 and a p channel type field effect transistor 207 are formed in the p-type well 203 and the surface portion 204, respectively.

The n channel type field effect transistor 206 comprises heavily doped n-type source and drain regions 208 and 209 separated by a channel forming region, a gate insulating film 210 extending over the channel forming region as well as parts of the source and drain regions 208 and 209, and the multi-level gate electrode 211 is constituted by a lower film 212 of a doped polysilicon and an upper film 213 of a refractory metal silicide. Similarly, the p channel type field effect transistor 207 comprises heavily doped p type source and drain regions 214 and 215 separated by a channel forming region, a gate insulating film covering the channel forming region as well as parts of the source and drain regions 214 and 215, and a multi-level gate electrode 216 constituted by a lower film 217 of the polysilicon and an upper film 218 of the refractory metal silicide. On the thick field oxide film 205 located between the p-type well 203 and the surface region 204 is provided an interconnection 219 which also has a multi-level structure with a lower film 220 of the polysilicon and an upper film 221 of the refractory metal silicide. In this instance, the upper films 213, 218 and 221 are formed of the tungsten silicide represented by the molecular formula of $WSi_2$. However, the upper films may be formed of another silicide as similar to the semiconductor device shown in FIG. 5. The upper film 221 extends over the drain regions 209 and 215, and, for this reason, the drain regions are electrically connected to each other through the interconnection 219.

The thick field oxide film 205, the n channel type and p channel type field effect transistors 206 and 207, and the interconnection 219 are covered with an inter-level insulating film 222 in which contact windows 223 and 224 are formed to expose the source regions 208 and 214, respectively, and voltage lines 225 and 226 respectively pass through the contact windows 223 and 224 and reaches the source regions 208 and 214, respectively.

Figure 9:
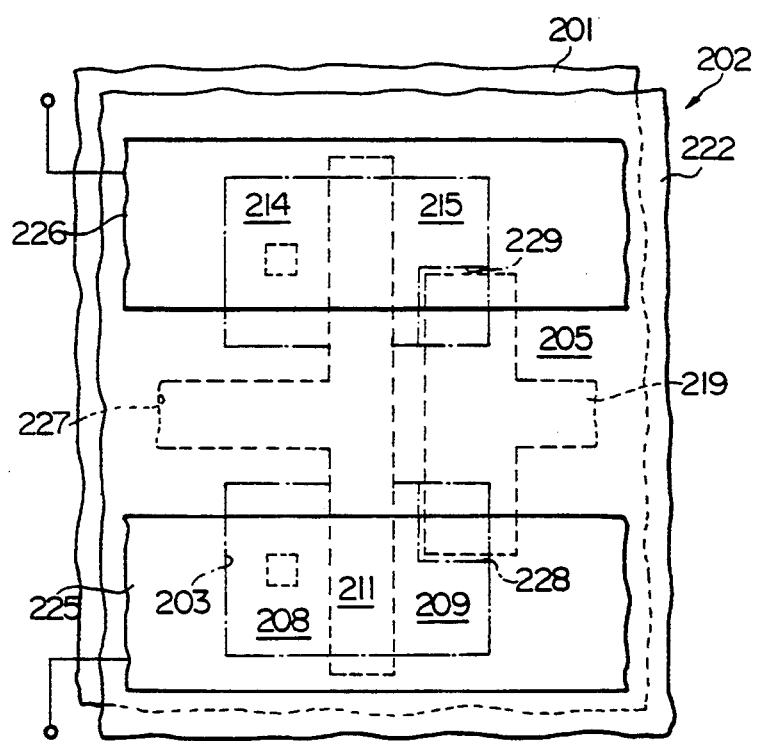
FIG. 9 is a plane view showing the layout of the semiconductor device shown in FIG. 8.

As will be better seen from FIG. 9, the multi-level gate electrodes 211 and 216 are provided in a multi-level wiring strip 227, and the multi-level interconnection 21 9 comes at the both end thereof into contact with respective contact areas 228 and 229 of the drain regions 209 and 215 in an ohmic fashion.

Figure 10A:
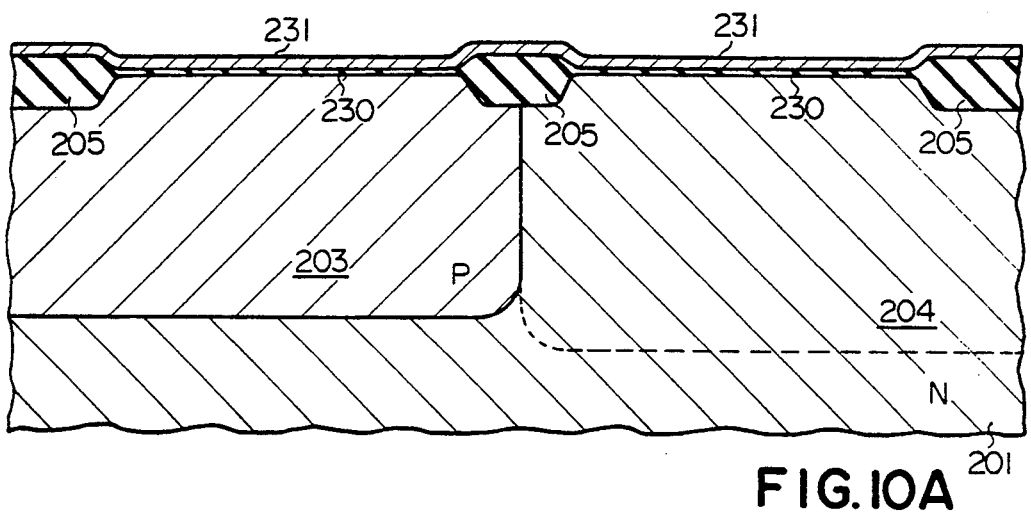
FIGS. 10A to 10F are cross sectional views showing a process sequence for fabricating the semiconductor device shown in FIG. 8.

Turning to FIGS. 10A to 10F, a process sequence for fabricating the semiconductor device shown in FIG. 8 is illustrated and starts with preparation of the substrate 201. In the substrate 201 is defined the p-type well 203 through lithographic techniques followed by an ion implantation, and the local oxidation of silicon techniques are applied to the resultant structure to form the thick field oxide film 205. A channel doping is carried out for adjustment of threshold voltage levels of the field effect transistors 206 and 207 of the enhancement type. On exposed portions of the substrate 201 are thermally grown a thin oxide film 230 on which a polycrystalline silicon film 231 is deposited by using a chemical vapor deposition technique. N type impurity atoms such as, for example, phosphorus are doped into the polycrystalline silicon film 231 so as to improve the conductivity. The resultant structure of this stage is illustrated in FIG. 10A.

Figure 10B:
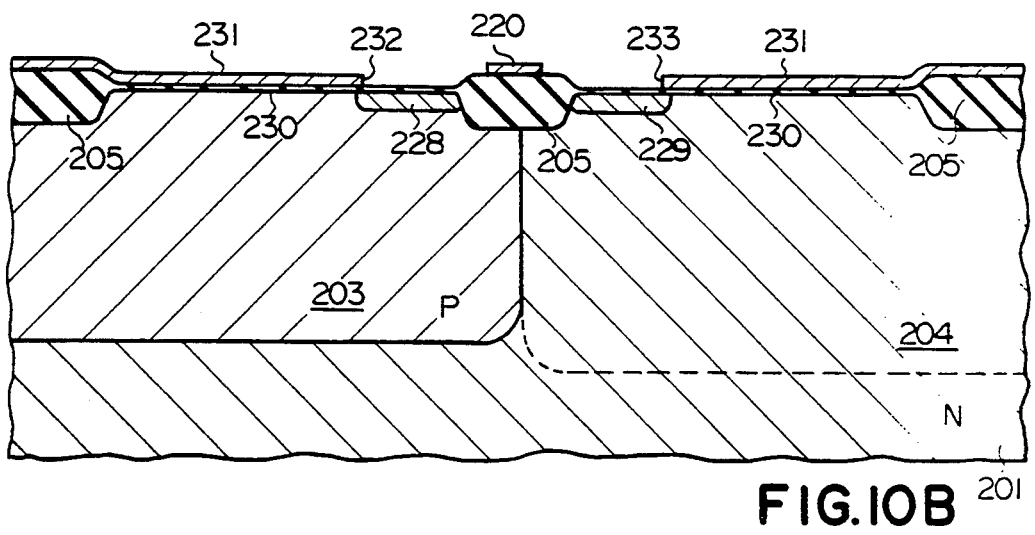

The subsequent stage is formation of a window 232. First, the lithographic techniques are applied to the polycrystalline silicon layer 231 to form a photo-mask layer, and the doped polycrystalline silicon film 231 is partially etched away to expose the thin oxide film 130 over the contact areas 228 and to form the lower film 220. Through the window 232 are heavily doped the contact area 228 with n type impurity atoms such as, for example, phosphorus or arsenide, thereby forming the contact area 228 for the ohmic manner. After the photomask layer is stripped off, the lithographic process is repeated to form another photo-mask layer exposing the thin oxide film 230 over the contact area 229. P type impurity atoms such as boron are introduced into the contact area 229 through a window 233 in the polycrystalline silicon 231 thereby forming the heavily doped contact area 229 for the ohmic contact. Since the polycrystalline silicon layer 231 perfectly covers the parts of the thin oxide film 230 serving as the gate oxide films of the field effect transistors 206 and 207, the gate oxide films are free from any contamination due to an etchant used in the etching process. The resultant structure of this stage is illustrated in FIG. 10B.

Figure 10C:
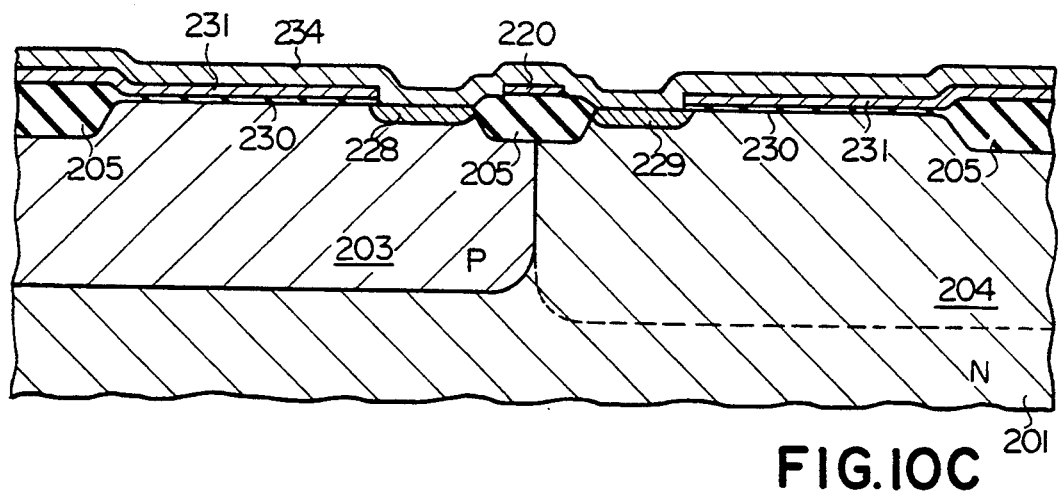

When the photo-mask layer for the contact area 229 is stripped off, the thin oxide film 230 is partially etched away so as to expose the contact areas 228 and 229 by using the polycrystalline silicon film 231 as a mask. In this etching stage, the thick field oxide film 205 exposed to the etchant is slightly decreased in the thickness. A tungsten silicide is sputtered over the entire surface of the structure to form a silicide film 234, however, a chemical vapor deposition technique may be alternatively employed for the deposition of the tungsten silicide. The silicide film 234 is brought into contact with the contact areas 228 and 229, and the polycrystalline silicon layer 131 is overlain by the silicide film 234, thereby achieving the multi-level structure. The resultant structure of this stage is illustrated in FIG. 10C.

Figure 10D:
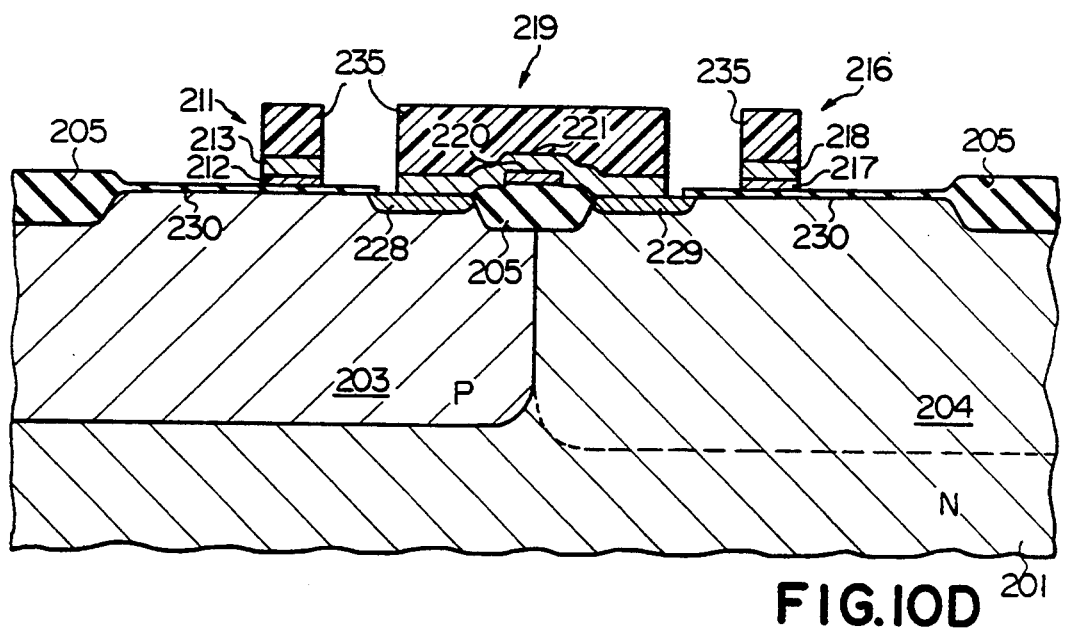

A solution of a photoresist material is spun coated on the entire surface of the structure to form a photoresist film, and the photoresist film is patterned through the lithographic process to form a photo-mask layer 235 which exposes the silicide film 234 except for using as the gate electrodes 211 and 216 as well as the interconnection 219. Using the photo-mask layer 235, the silicide film 234 and, thereafter, the polycrystalline silicon film 231 are partially etched away to form the multi-level gate electrodes 211 and 21 6 and the multi-level interconnection 219 by using appropriate etchants, respectively. The gate electrodes 211 and 216 and the interconnection 219 are thus formed by using the deposition technique and the lithographic process only, so that no heat treatment participates the formation of the gate electrodes and the interconnection. In other words, the side walls of the gate electrodes can not be covered with any silicide films even if the spacers are not provided thereon, and the gate electrodes are free from any short circuiting. For this reason, the process sequence according to the present invention is simplified in comparison with the prior art process shown in FIGS. 4A to 4C. In this process sequence, the contact areas 228 and 229 have been formed before the deposition stage for the silicide, so that the interconnection 219 is widely brought into contact with the contact areas 228 an 229 and, accordingly, decreased in contact resistance. The photo-mask layer 235 is patterned in such a manner as not to overlap the thin oxide film 230 for the later doping stage. The resultant structure of this stage is illustrated in FIG. 10D.

Figure 10E:
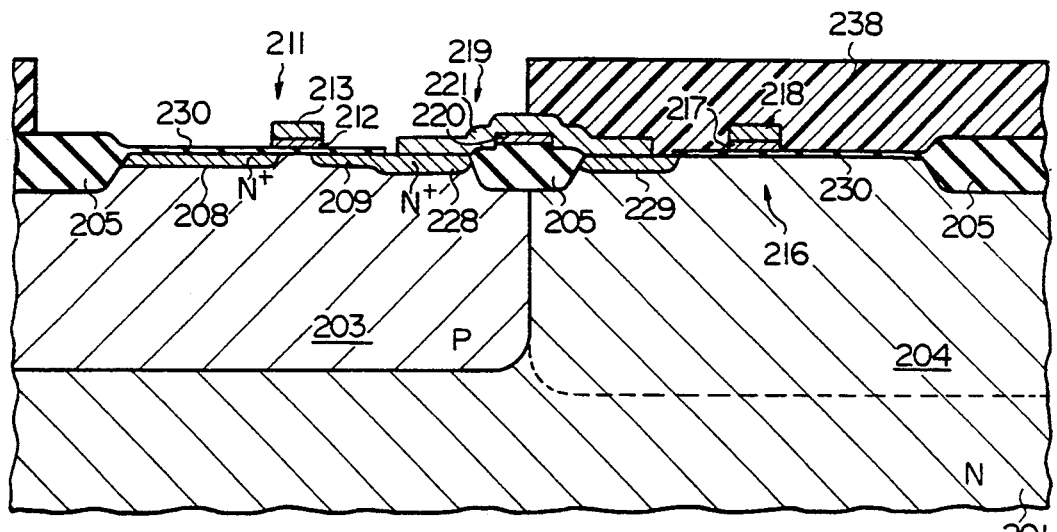

A solution of the photoresist material is spun onto the entire surface of the structure to form a photoresist film again, and the photoresist film is patterned to provide a photo-mask layer 238 covering the surface portion 204 but exposing the p type well 203. N type impurity atoms such as phosphorus or arsenic are implanted into the exposed substrate 201 , and, accordingly, the heavily doped source and drain regions 208 and 209 are formed outside of the gate electrode 21 1 . The drain region 209 and the contact area 228 are merged with each other, and, accordingly, the interconnection 219 is electrically coupled to the drain region 209. The resultant structure of this stage is illustrated in FIG. 10E.

Figure 10F:
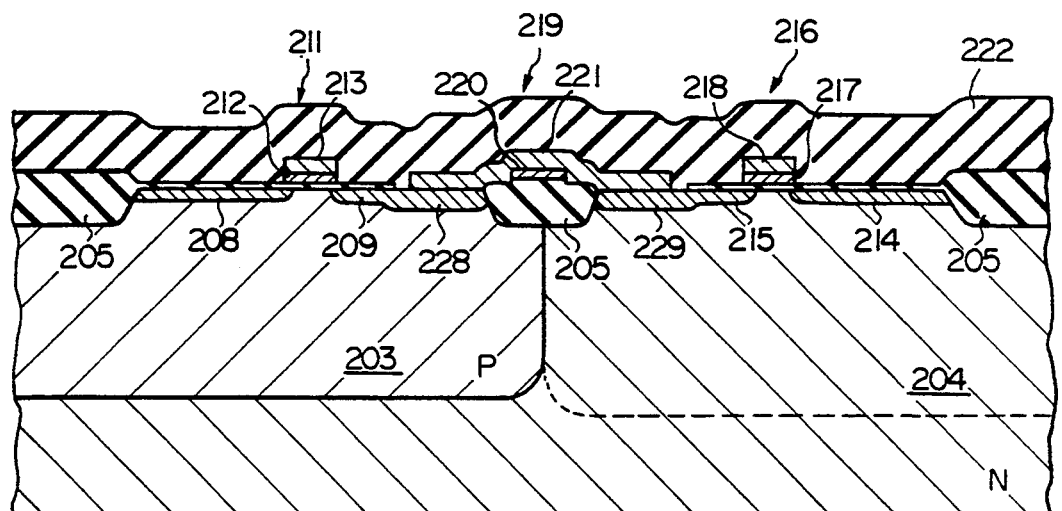

After the formation of the heavily doped source and drain regions 208 and 209, the photo-mask layer 238 is stripped off, and a solution of the photoresist material is spun onto the entire surface again to form a photoresist film. The photoresist film is patterned to expose the surface portion 204 but cover the p type well 203. P type impurity atoms such as, for example, boron are implanted into the exposed substrate 201, thereby forming the heavily doped source and drain regions 214 and 215. The drain region 215 is similarly merged with the contact area 229, so that the interconnection 21 9 is further coupled to the drain region 215. The photo-mask is stripped off from the substrate 201 . Subsequently, the inter-level insulating layer 222 of, for example, a phosphosilicate glass is deposited on the entire surface, and a heat treatment is carried out for activation of the implanted impurity atoms. During the heat treatment, the implanted impurity atoms are diffused into the substrate 201, and, accordingly, the drain regions 209 and 215 are perfectly merged with the contact areas 228 and 229, respectively. Then, a-conduction path is established between the drain regions 209 and 21 5. The resultant structure is illustrated in FIG. 10F.

Finally, the contact windows 223 and 224 are formed in the inter-level insulating layer 222, and the voltage lines 225 and 226 are patterned and reach the respective source regions 208 and 224 through the contact windows 223 and 224, respectively, as shown in FIG. 8.

Figure 11:
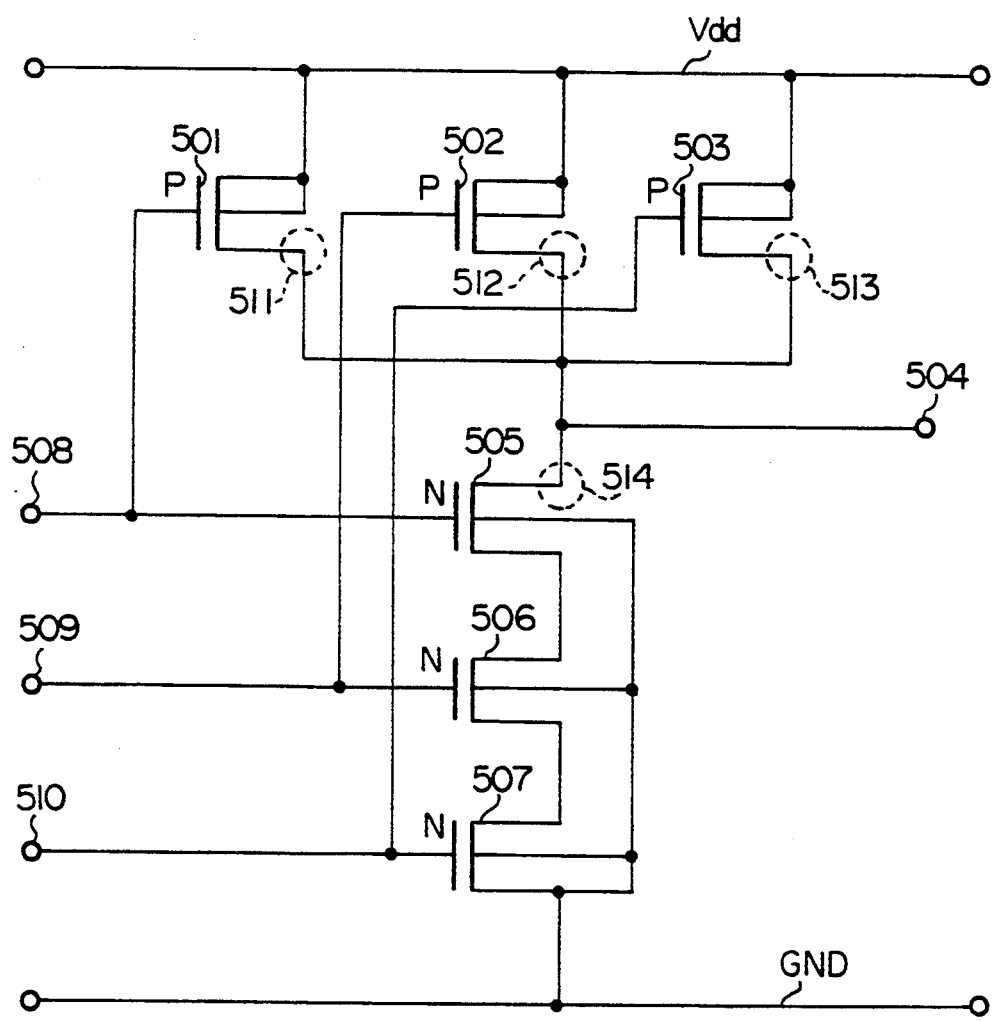
FIG. 11 is a circuit diagram showing the circuit arrangement of a NAND gate to which the present invention appertains.

Turning to FIG. 11 of the drawings, a NAND gate comprises three p-channel type field effect transistors 501, 502 and 503 coupled in parallel between a source of positive voltage level Vdd and an output node 504, and three n-channel type field effect transistors 505, 506 and 507 coupled in series between the output node 504 and a source of ground voltage level GND. The p-channel type field effect transistors 501 to 503 are electrically isolated from one another and formed on an n-type silicon substrate. On the other hand, the n-channel type field effect transistors 505 to 507 are formed in respective p-well defined in the n-type silicon substrate. Three input nodes 508, 509 and 510 are coupled to the gate electrodes of the p-channel type field effect transistors 501 to 503, respectively, and further to the gate electrodes of the n-channel type field effect transistors 505 to 507. The multiple-level structure formed by a silicide film and a polysilicon film is applied to respective interconnection encircled in dash lines 511, 512, 513 and 514, respectively.

The NAND gate thus arranged achieves the NAND function with three input signals supplied to the input nodes 508 to 510. In detail, if one of the input signals is in the ground voltage level or logic "0" level, one of the p-channel type field effect transistors 501 to 503 turns on to provide a conduction path between the source of positive high voltage level Vdd and the output node 504, so that an output signal of the positive high voltage level appears on the output node 504. If all of the input signals are in the positive high voltage level Vdd or the logic "1" level, all of the p-channel type field effect transistors 501 to 503 turn on and all of the n-channel type field effect transistors 505 to 507 are turned on, so that the ground voltage level is propagated from the source of ground voltage level GND through the n-channel type field effect transistors 505 to 507 to the output node 504. Then, the output signal of logic "0" level appears on the output node 504.

Figure 12:
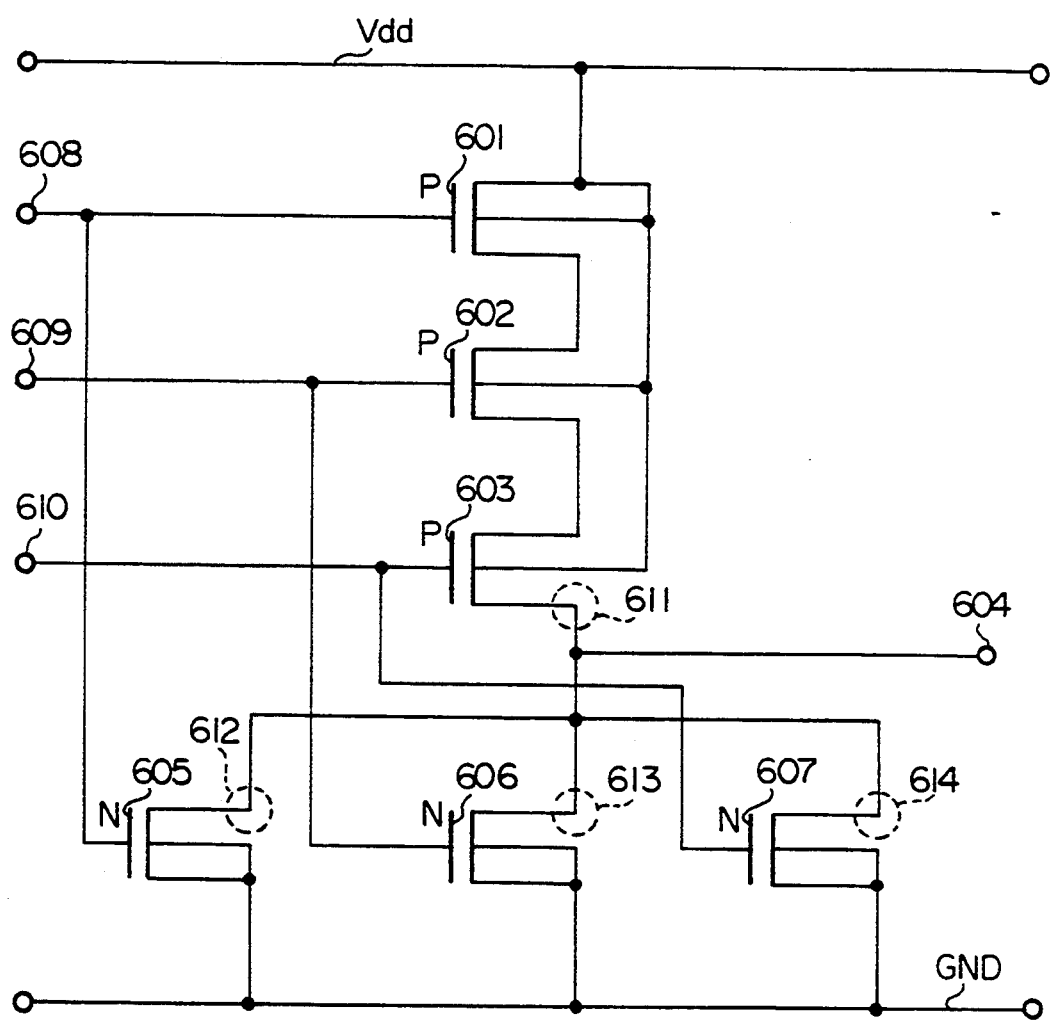
FIG. 12 is a circuit arrangement showing the circuit arrangement of a NOR gate to which the present invention appertains.

Turning to FIG. 12 of the drawings, a NOR gate comprises three p-channel type field effect transistors 601, 602 and 603 coupled in series between a source of positive voltage level Vdd and an output node 604, and three n-channel type field effect transistors 605, 606 and 607 coupled in parallel between the output node 604 and a source of ground voltage level GND. The p-channel type field effect transistors 601 to 603 are electrically isolated from one another and formed on an n-type silicon substrate. On the other hand, the n-channel type field effect transistors 605 to 607 are formed in respective p-well defined in the n-type silicon substrate. Three input nodes 608, 609 and 610 are coupled to the gate electrodes of the p-channel type field effect transistors 601 to 603, respectively, and further to the gate electrodes of the n-channel type field effect transistors 605 to 607. The multiple-level structure formed by a silicide film and a polysilicon film is applied to respective interconnections encircled in dash lines 611, 612, 613 and 614, respectively.

The NOR gate thus arranged achieves the NOR function with three input signals supplied to the input nodes 608 to 610. In detail, if all of the input signals are in the ground voltage level or logic "1" level, all of the p-channel type field effect transistors 601 to 603 turns on to provide a conduction path between the source of positive high voltage level Vdd and the output node 604, so that an output signal of the positive high voltage level appears on the output node 604. If one of the input signals is in the positive high voltage level Vdd or the logic "1" level, one of the p-channel type field effect transistors 601 to 603 turns off and one of the n-channel type field effect transistors 605 to 607 is turned on to provide a conduction path between the source of ground voltage level and the output node 604, so that the ground voltage level is propagated from the source of ground voltage level GND through the n-channel type field effect transistor 605, 606 or 607 to the output node 604. Then, the output signal of logic "0" level appears on the output node 604.

Although particular embodiment of the present invention have been shown and described, it will be obvious to those skilled in the art that various changes and modifications may be made without departing from the spirit and scope of the present invention.

What is claimed is:

1. A process of fabricating a semiconductor device providing an integrated circuit, comprising the steps of:
   a) preparing a semiconductor substrate of a first conductivity type;
   b) forming a well of a second conductivity type opposite to said first conductivity type in said semiconductor substrate;
   c) forming a thick insulating film, a part of which is provided on a boundary area between said well and a surface region of the semiconductor substrate;
   d) forming thin insulating films on the surface of said well and the surface of said surface region, respectively;
   e) depositing a conductive polycrystalline silicon film of the first conductivity type over said thin insulating films and said thick insulating film;
   f) patterning said conductive polycrystalline silicon film so as to expose parts of said thin insulating films over respective contact areas on both sides of said part of said thick insulating film to openings formed in said conductive polycrystalline silicon film, a part of said conductive polycrystalline silicon film, formed narrower than said part of said thick insulating film, being left on said part of said thick insulating film for providing a lower layer of an interconnection;
   g) removing said parts of said thin insulating films on both sides of said part of said thick insulating film for exposing said contact areas through openings respectively formed in said thin insulating films to said opening formed in said conductive polycrystalline silicon film;
   h) exposing said contact areas through the openings;
   i) depositing a conductive silicide film on the entire surface, said conductive silicide film being held in contact with said contact areas and said part of said conductive polycrystalline silicon film;
   j) patterning said conductive silicide film to form an upper film on said interconnection and respective upper films of gate electrodes, said upper film of said interconnection being wider than said pan of said thick insulating film so as to be directly held in contact with said contact area;
   k) patterning said conductive polycrystalline silicon film to form respective lower films of said gate electrodes beneath said upper films of said gate electrodes; and
   k) forming source and drain regions of said first conductivity type in said well and forming source and drain regions of said second conductivity type in said surface region in such a manner that the drain regions are brought into contact with the upper film of said interconnection, said drain regions penetrating into said contact areas, respectively, thereby completing a first field effect transistor of a first channel conductivity type in said well and a second field effect transistor of a second channel conductivity type opposite to said first channel conductivity type in said surface region.

2. A process of fabricating a semiconductor device as set forth in claim 1, in which said thick insulating film is formed by using a local oxidation of silicon technique.

3. A process of fabricating a semiconductor device as set forth in claim 1, which said thin insulating films are formed by using a thermal oxidation technique.

4. A process of fabricating a semiconductor device as set forth in claim 1, in which said step 1) further includes the sub-steps of 1-1) forming a first photoresist mask exposing said well, 1-2) doping said well with impurity atoms of said first conductivity type by using said first photoresist mask, 1-3) stripping said first photoresist mask, 1-4) forming a second photoresist mask exposing said surface region, 1-5) doping said surface region with impurity atoms of said second conductivity type by using said second photoresist mask, 1-6) stripping said second photoresist mask, 1-7) depositing an inter-level insulating film on the entire surface, and 1-8) applying heat to diffuse said impurity atoms in said well and said surface region, thereby extending said drain regions into said contact areas.

5. A process of fabricating a semiconductor device as set forth in claim 1, in which said process further comprises the step of doping the contact areas in said well and said surface region with impurity atoms of said first and second conductivity types, respectively, after said step h).

6. A process for fabricating a semiconductor device as set forth in claim 1, in which said step of forming source and drain regions of said first conductivity type further includes a sub-step of selectively doping second impurity atoms in said well.

7. A process for fabricating a semiconductor device as set forth in claim 6, in which said step of forming source and drain regions of said second conductivity type further includes a sub-step of selectively doping first impurity atoms in said surface region.

* * * * *